(12) United States Patent
Yang

(10) Patent No.: US 11,417,795 B2
(45) Date of Patent: Aug. 16, 2022

(54) DIE-BONDING METHOD AND SPRAYING DEVICE FOR LED

(71) Applicant: Wuhan China Star Optoelectronics Technology Co., Ltd., Wuhan (CN)

(72) Inventor: Yong Yang, Wuhan (CN)

(73) Assignee: Wuhan China Star Optoelectronics Technology Co., Ltd., Wuhan (CN)

( * ) Notice: Subject to any disclaimer, the term of this patent is extended or adjusted under 35 U.S.C. 154(b) by 240 days.

(21) Appl. No.: 16/638,480

(22) PCT Filed: Jun. 17, 2019

(86) PCT No.: PCT/CN2019/091463
§ 371 (c)(1),
(2) Date: Feb. 12, 2020

(87) PCT Pub. No.: WO2020/087940
PCT Pub. Date: May 7, 2020

(65) Prior Publication Data
US 2021/0217924 A1 Jul. 15, 2021

(30) Foreign Application Priority Data
Oct. 29, 2018 (CN) .......................... 201811270957.2

(51) Int. Cl.
*H01L 33/00* (2010.01)
*H01L 23/00* (2006.01)

(52) U.S. Cl.
CPC .......... *H01L 33/0093* (2020.05); *H01L 24/83* (2013.01); *H01L 2224/83815* (2013.01); *H01L 2924/12041* (2013.01)

(58) Field of Classification Search
CPC ........ B23K 3/06–0623; H01L 33/0093; H01L 21/6715; H01L 2924/12041
See application file for complete search history.

(56) References Cited

U.S. PATENT DOCUMENTS

| | | | |
|---|---|---|---|
| 2010/0270357 A1* | 10/2010 | Honma | B23K 1/0016 228/9 |
| 2011/0079814 A1 | 4/2011 | Chen | |
| 2012/0286064 A1 | 11/2012 | Chang et al. | |
| 2014/0054632 A1 | 2/2014 | Nolan et al. | |
| 2019/0013450 A1* | 1/2019 | Ploessl | H01L 24/81 |

FOREIGN PATENT DOCUMENTS

| | | |
|---|---|---|
| CN | 102909143 | 2/2013 |
| CN | 203578047 | 5/2014 |
| CN | 104056753 | 9/2014 |

* cited by examiner

*Primary Examiner* — Julio J Maldonado
*Assistant Examiner* — Stanetta D Isaac

(57) ABSTRACT

A die-bonding method and a spraying device for an LED include: providing a substrate provided with a pad and a white oil layer covering wiring, placing a steel mesh on the substrate, and then spraying suspension containing solder paste on the pad by the spraying device, to form a solder paste film layer. Finally, a reflow process for the solder is performed. The solder paste is prepared on the pad by spraying, so that a crystal wafer is prevented from being tilted or short-circuited due to pulling or dragging of the solder paste during the reflow process for the solder, thereby improving uneven brightness of the surface light source.

16 Claims, 3 Drawing Sheets

DIE-BONDING METHOD AND SPRAYING DEVICE FOR LED

RELATED APPLICATIONS

This application is a National Phase of PCT Patent Application No. PCT/CN2019/091463 having International filing date of Jun. 17, 2019, which claims the benefit of priority of Chinese Patent Application No. 201811270957.2 filed on Oct. 29, 2018. The contents of the above applications are all incorporated by reference as if fully set forth herein in their entirety.

FIELD AND BACKGROUND OF THE INVENTION

The present invention relates to the field of LED-packaging technology, and in particular, to a die-bonding method and a spraying device for an LED.

In the die-bonding process of miniLED (mini Light-Emitting Diode), the traditional solder paste coating method is generally used for soldering. Due to the application of the solder paste coating, the coating steel mesh used cannot precisely control the amount of solder paste, which causes the solid crystal wafer to tilt due to pulling and dragging of the solder paste during a subsequent reflow process for the solder. Thereby, the light-emitting direction of the wafer is changed, and the uniformity of light mixing of the surface light source is deteriorated.

SUMMARY OF THE INVENTION

The invention provides a die-bonding method and a spraying device for an LED to solve the technical problem of the existing die-bonding method for the LED as follows: Due to the traditional solder paste coating method used for soldering, the amount of solder paste cannot be precisely controlled, which causes the solid crystal wafer to tilt due to pulling and dragging of the solder paste during the subsequent reflow process for the solder; thereby, the light-emitting direction of the wafer is changed, and the uniformity of light mixing of the surface light source is deteriorated.

In order to solve the above problems, the technical solution provided by the present invention is as follows:

The invention provides a die-bonding method for an LED, comprising:

S10, providing a substrate, the substrate provided with a pad and a white oil layer covering wiring;

S20, providing a spraying device, where the spraying device includes a liquid circulation unit, a pressurization flow-control unit connected to the liquid circulation unit, and a nozzle connected to the pressurization flow-control unit, and an opening area of the nozzle is 0.5 to 0.8 times the area of the pad;

S30, placing a steel mesh on the substrate, where the steel mesh is disposed corresponding to the pad, and a vertical distance between the nozzle and the steel mesh is 1 to 5 mm;

S40, introducing a suspension containing solder paste into the liquid circulation unit, and mixing uniformly;

S50, using the pressurization flow-control unit to control an amount of spraying of the nozzle, and spraying the suspension on the pad, to form a solder paste film layer;

S60, placing an LED wafer on the solder paste film layer; and

S70, carrying out the substrate, on which the LED is placed, to a reflow process for the solder.

In at least one embodiment of the invention, before the S60, the method further includes:

spraying, by the spraying device, soldering flux on the solder paste film layer to form a soldering-flux layer.

In at least one embodiment of the invention, before the S60, the method further includes:

spraying, by the spraying device, an anti-oxidant on the soldering-flux layer to form an antioxidant layer.

In at least one embodiment of the invention, the S40 includes:

S401, including, by the liquid circulation unit, a U-shaped tube, and introducing the suspension into the U-shaped tube; and S402, introducing gas into both ends of the U-shaped tube to uniformly mix the suspension.

In at least one embodiment of the invention, before the S401, the method further includes: mixing and stirring the solder paste with a low-boiling organic solvent to form the suspension.

In at least one embodiment of the invention, in the S50, the nozzle sprays the suspension on the surface of the pad by row-by-row or column-by-column scanning.

In at least one embodiment of the invention, after the S50, the steel mesh is detached from the substrate.

The invention provides another die-bonding method for an LED, comprising:

S10, providing a substrate, the substrate provided with a pad and a white oil layer covering wiring;

S20, providing a spraying device, where the spraying device includes a liquid circulation unit, a pressurization flow-control unit connected to the liquid circulation unit, and a nozzle connected to the pressurization flow-control unit;

S30, placing a steel mesh on the substrate, where the steel mesh is disposed corresponding to the pad;

S40, introducing a suspension containing solder paste into the liquid circulation unit, and mixing uniformly;

S50, using the pressurization flow-control unit to control an amount of spraying of the nozzle, and spraying the suspension on the pad, to form a solder paste film layer;

S60, placing an LED wafer on the solder paste film layer; and

S70, carrying out the substrate, on which the LED is placed, to a reflow process for the solder.

In at least one embodiment of the invention, before the S60, the method further includes:

spraying, by the spraying device, soldering flux on the solder paste film layer to form a soldering-flux layer.

In at least one embodiment of the invention, before the S60, the method further includes:

spraying, by the spraying device, an anti-oxidant on the soldering-flux layer to form an antioxidant layer.

In at least one embodiment of the invention, the S40 includes:

S401, including, by the liquid circulation unit, a U-shaped tube, and introducing the suspension into the U-shaped tube; and S402, introducing gas into both ends of the U-shaped tube to uniformly mix the suspension.

In at least one embodiment of the invention, before the S401, the method further includes: mixing and stirring the solder paste with a low-boiling organic solvent to form the suspension.

In at least one embodiment of the invention, an opening area of the nozzle is 0.5 to 0.8 times the area of the pad.

In at least one embodiment of the invention, a vertical distance between the nozzle and the steel mesh is 1 to 5 mm.

In at least one embodiment of the invention, in the S50, the nozzle sprays the suspension on the surface of the pad by row-by-row or column-by-column scanning.

In at least one embodiment of the invention, after the S50, the steel mesh is detached from the substrate.

The invention also provides a spraying device, comprising: a liquid circulation unit, a pressurization flow-control unit and a nozzle; wherein the liquid circulation unit includes a U-shaped tube for carrying a liquid; the pressurization flow-control unit is connected to the liquid circulation unit, the pressurization flow-control unit provided with a knob and a striker; the nozzle is disposed under the pressurization flow-control unit and connected to the pressurization flow-control unit, the nozzle provided with an atomization assembly.

In at least one embodiment of the invention, the pressurization flow-control unit is disposed at a bottom of the U-shaped tube and connected to the U-shaped tube.

In at least one embodiment of the invention, the knob is disposed at an upper portion of the striker to control an opening size of the striker.

In at least one embodiment of the invention, two end portions of the U-shaped tube are oppositely provided with two gas inlets The beneficial effects of the present invention are as follows: The invention performs soldering of solder paste by spraying solder paste on a pad to form a film, thereby preventing the crystal wafer from tilting or short-circuiting due to the solder paste pulling or dragging the crystal wafer during the subsequent reflow process for the solder. The phenomenon of a faulty soldered-joint caused by white oil between the positive and negative electrodes of the pad can be avoided, to improve the luminous efficiency of the surface light source and the yield of the die-bonding operation.

BRIEF DESCRIPTION OF THE SEVERAL VIEWS OF THE DRAWINGS

In order to more clearly illustrate the technical solutions in the embodiments of the present invention, the drawings used in the description of the embodiments will be briefly described below. It is obvious that the drawings in the following description are only some embodiments of the present invention. Other drawings can also be obtained from those skilled in the art based on these drawings without paying any creative effort.

DESCRIPTION OF SPECIFIC EMBODIMENTS OF THE INVENTION

Figure 1:
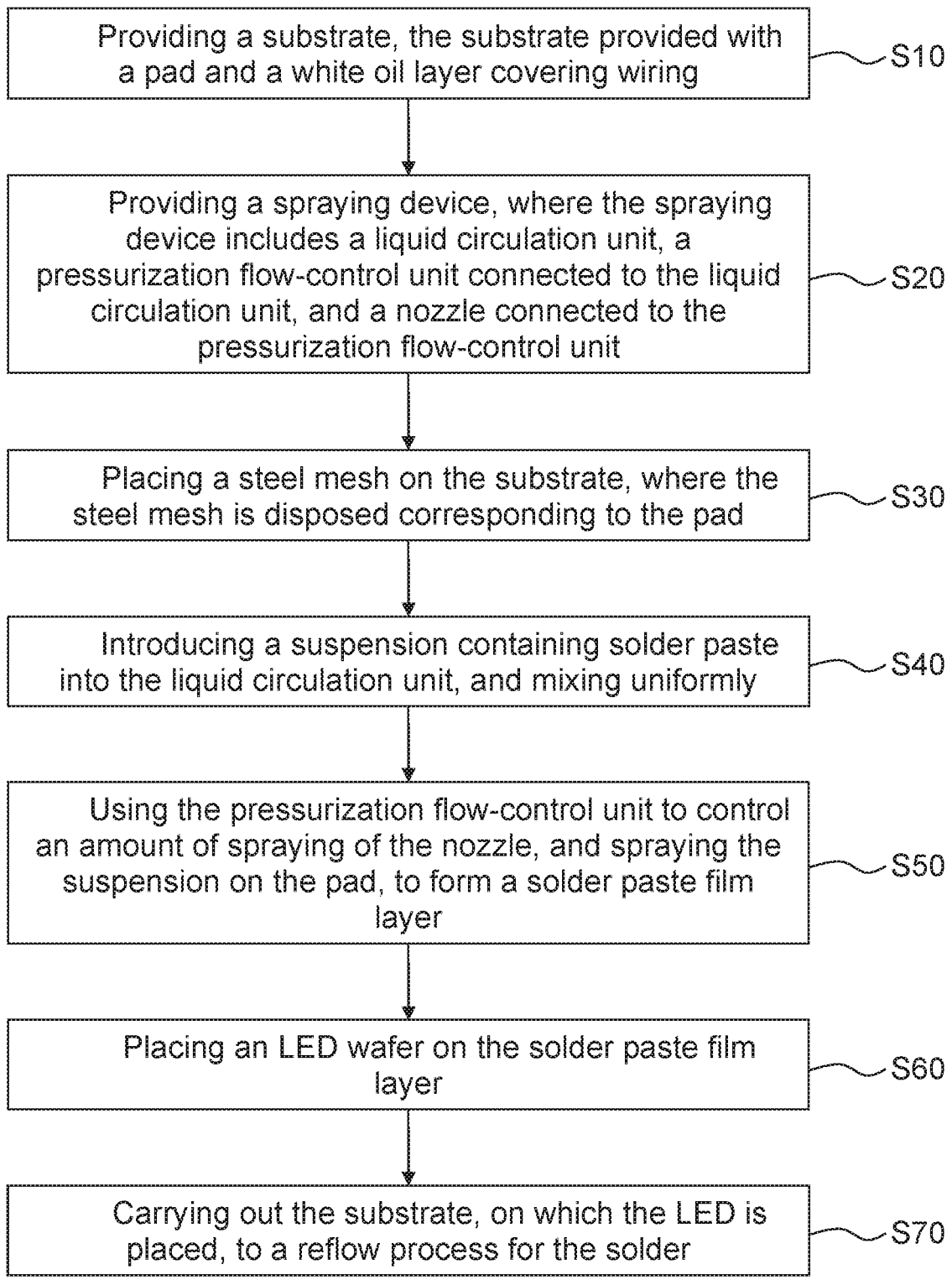
FIG. 1 is a flow chart of steps of a die-bonding method for an LED of the present invention.

The following description of the embodiments is with reference to the drawings and is provided to illustrate the specific embodiments of the invention. The directional terms mentioned in the present invention, such as 'upper', 'lower', 'front', 'back', 'left', 'right', 'top', 'bottom', etc., are only the directions in the drawings. Therefore, the directional terminology used is for the purpose of illustration and understanding of the invention rather than limiting the invention. In the figures, structurally similar elements are denoted by the same reference numerals.

The invention is directed to the technical problem of the existing die-bonding method for the LED as follows: Due to the solder paste brushing/coating method used for soldering the LED to the pad, the crystal wafer tilts due to pulling and dragging of the solder paste during the subsequent reflow process for the solder; thereby, the light-emitting direction of the wafer is changed, and the uniformity of light mixing of the surface light source is deteriorated. This embodiment can solve the drawback.

Figure 2:
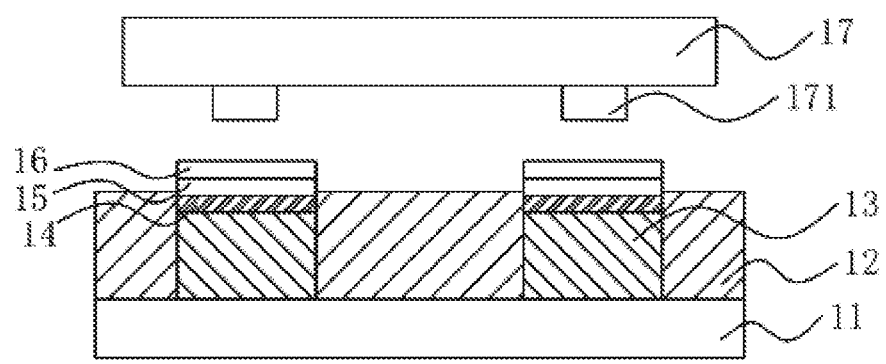
FIG. 2 is a schematic diagram of a wafer structure for an LED of the present invention prior to die bonding.
Figure 3:
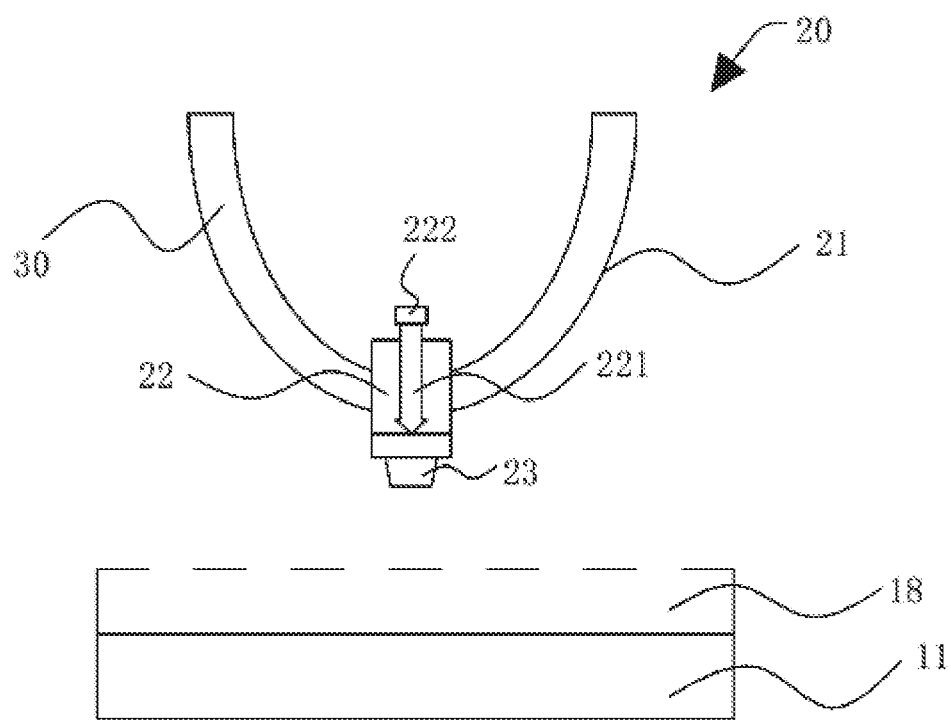
FIG. 3 is a schematic diagram of a structure of a spraying device of the present invention.

As shown in FIG. 1 to FIG. 3, the present invention provides a die-bonding method for an LED, comprising the following steps:

S10, providing a substrate 11, the substrate 11 provided with a pad 13 and a white oil layer 12 covering wiring;

S20, providing a spraying device 20, the spraying device 20 including a liquid circulation unit 21, a pressurization flow-control unit 22 connected to the liquid circulation unit 21, and a nozzle 23 connected to the pressurization flow-control unit 22;

S30, placing a steel mesh 18 on the substrate 11, the steel mesh disposed corresponding to the pad 13;

S40, introducing a suspension 30 containing solder paste into the liquid circulation unit 21, and mixing uniformly;

S50, using the pressurization flow-control unit 22 to control the amount of spraying of the nozzle 23, and spraying the suspension 30 on the pad 13, to form a solder paste film layer 14;

S60, placing an LED wafer 17 on the solder paste film layer 14;

S70, carrying out the substrate 11, on which the LED is placed, to a reflow process for the solder.

Before the LED wafer 17 is placed on the solder paste film layer 14, the die-bonding method further comprises: spraying soldering flux on the solder paste film layer 14 to form a soldering-flux layer 15 where the soldering flux is used to increase adhesion between the solder paste film layer 14 and the LED wafer 17; spraying an anti-oxidant on the soldering-flux layer 15 to form an antioxidant layer 16 where the anti-oxidant prevents the solder paste film layer 14 from being oxidized and yellowed.

A film formation manner of the soldering-flux layer 15 and the antioxidant layer 16 is the same as that of the solder paste film layer 14, all films of which can be formed by spraying by a spraying device.

In the S30, the steel mesh 18 is disposed corresponding to the pad 13, exposing a portion of the pad 13. A mesh area of the steel mesh 18 is smaller than the area of the pad 13. In the embodiment, the mesh area of the steel mesh 18 is half of the area of the pad 13.

In the S40, the solder paste is first mixed with a low-boiling organic solvent, and stirred to form the suspension 30; the suspension 30 is further introduced into the liquid circulation unit 21, and specifically, the suspension 30 is introduced into a U-shaped tube in the liquid circulation unit 21; Gas is then introduced into both ends of the U-shaped tube, and the suspension 30 in the U-shaped tube is uniformly mixed by blowing.

In S50, the pressurization flow-control unit 22 includes a knob 222 and a striker 221, and by adjusting the knob 222, the size of an opening of the striker 221 is controlled, thereby controlling the amount of sprayed; an infusion tube is disposed in the pressurization flow-control unit 22, the infusion tube is connected to the nozzle 23, and spray pressure of the nozzle 23 is controlled by an electromagnetic valve which compresses air; the nozzle 23 contains an atomization assembly, and gas is introduced into the nozzle 23 so that the suspension 30 in the nozzle 23 is uniformly mixed.

After preparation of the solder paste film layer is completed, the steel mesh 18 is detached from the substrate 11, and then a subsequent process is performed.

In the process of spraying the suspension 30, a vertical distance between the nozzle 23 and the steel mesh 18 is 1 to 5 mm, an opening area of the nozzle 23 is 0.5 to 0.8 times the area of the pad 13, and the nozzle 23 performs 2~5 times of column-by-column or row-by-row scanning spraying on the surface of the steel mesh 18. The suspension 30 containing the solder paste falls on the surface of the pad 13 and diffuses toward other unexposed portions of the pad 13. After the low-boiling organic solvent in the suspension 30 is volatilized, the solder paste film layer 14 of a specific thickness is formed, and then the soldering flux and the anti-oxidant are sprayed on the solder paste film layer 14 by the same or similar processes.

In the S60 and the S70, the LED wafer 17 is first bonded to the solder paste film layer 14, specifically, the LED wafer 17 is bonded to the surface of the antioxidant layer 16, and positive and negative electrodes 171 of the LED wafer 17 respectively correspond to positive and negative electrodes of the pad 13; the substrate on which the LED wafer 17 is placed is then placed in a reflow apparatus for the solder for the reflow process for the solder. Under high temperature conditions, the solder paste film layer 14 and the soldering-flux layer 15 are melted by heat, and according to the principle of liquid surface tension, the solder paste moves toward an area reduction direction. Since surface energy of wafer pins is larger, after solder reflow, the solder paste completely wraps the pins of the wafer, and the soldering-flux layer 15 decomposes or volatilizes under high temperature conditions. Finally, a die-bonding position of the wafer does not change significantly and the reflow process for the solder is completed in the case.

Copper wiring is formed on the substrate, the white oil layer covers the copper wiring, the white oil layer and the copper wiring are patterned by a yellow light process, and a location between the positive and negative electrodes of the pad is filled with white oil, increasing reflectivity of the substrate 11, thereby increasing light efficiency of the LED; The thickness of the solder paste spraying/coating is estimated according to the difference in height between the white oil film layer and the pad 13, thereby controlling the amount of solder paste to avoid occurrence of a faulty-soldered-joint phenomenon.

As shown in FIG. 3, the present invention provides a spraying device 20 which can be used in a die-bonding operation of the above LED, the spraying device 20 including a liquid circulation unit 21, a pressurization flow-control unit 22, and a nozzle 23.

The liquid circulation unit 21 includes a U-shaped tube for carrying a liquid, two end portions of the U-shaped tube are oppositely provided with two gas inlets, gas is introduced into the two inlets, and the liquid in the U-shaped tube is uniformly mixed by blowing action.

The pressurization flow-control unit 22 is disposed at a bottom of the U-shaped tube and connected to the U-shaped tube. The pressurization flow-control unit 22 includes a knob 222 and a striker 221. The knob 222 is disposed at an upper portion of the striker 221 to control an opening size of the striker 221. The pressurization flow-control unit 22 is provided with a flow duct, and the spray pressure can be controlled by controlling the electromagnetic valve in the flow duct to compress the air.

The nozzle 23 is disposed directly under the pressurization flow-control unit 22. The nozzle 23 is connected to the pressurization flow-control unit 22. The opening area of the nozzle 23 is 0.5 to 0.8 times the area of the pad 13. An atomization assembly is disposed in the nozzle 23. The nozzle 23 further includes a gas passage opening, which opens the gas into the nozzle 23, to make the liquid in the nozzle 23 mix uniformly.

Beneficial effects: The invention performs soldering of solder paste by spraying solder paste on a pad to form a film, thereby preventing the crystal wafer from tilting or short-circuiting due to the solder paste pulling or dragging the crystal wafer during the subsequent reflow process for the solder. The phenomenon of a faulty soldered-joint caused by white oil between the positive and negative electrodes of the pad can be avoided, to improve the luminous efficiency of the surface light source and the yield of the die-bonding operation.

In the above, although the present invention has been disclosed in the above preferred embodiments, the above-described preferred embodiments are not intended to limit the invention, and those skilled in the art can make various changes and retouches without departing from the spirit and scope of the present invention. The scope of protection of the present invention is determined by the scope defined by the claims.

What is claimed is:

1. A die-bonding method for an LED, comprising:

S10, providing a substrate, the substrate provided with a pad and a white oil layer covering wiring;

S20, providing a spraying device, where the spraying device includes a liquid circulation unit, a pressurization flow-control unit connected to the liquid circulation unit, and a nozzle connected to the pressurization flow-control unit, and an opening area of the nozzle is 0.5 to 0.8 times the area of the pad;

S30, placing a steel mesh on the substrate, where the steel mesh is disposed corresponding to the pad, and a vertical distance between the nozzle and the steel mesh is 1 to 5 mm;

S40, introducing a suspension containing solder paste into the liquid circulation unit, and mixing uniformly;

S50, using the pressurization flow-control unit to control an amount of spraying of the nozzle, and spraying the suspension on the pad, to form a solder paste film layer;

S60, placing an LED wafer on the solder paste film layer; and

S70, carrying out the substrate, on which the LED is placed, to a reflow process for the solder.

2. The die-bonding method for an LED as claimed in claim 1, wherein before the S60, the method further includes:

spraying, by the spraying device, soldering flux on the solder paste film layer to form a soldering-flux layer.

3. The die-bonding method for an LED as claimed in claim 2, wherein before the S60, the method further includes:

spraying, by the spraying device, an anti-oxidant on the soldering-flux layer to form an antioxidant layer.

4. The die-bonding method for an LED as claimed in claim 1, wherein the S40 includes:

S401, including, by the liquid circulation unit, a U-shaped tube, and introducing the suspension into the U-shaped tube; and

S402, introducing gas into both ends of the U-shaped tube to uniformly mix the suspension.

5. The die-bonding method for an LED as claimed in claim 4, wherein before the S401, the method further includes: mixing and stirring the solder paste with a low-boiling organic solvent to form the suspension.

6. The die-bonding method for an LED as claimed in claim 4, wherein in the S50, the nozzle sprays the suspension on the surface of the pad by row-by-row or column-by-column scanning.

7. The die-bonding method for an LED as claimed in claim 1, wherein after the S50, the steel mesh is detached from the substrate.

8. A die-bonding method for an LED, comprising:
S10, providing a substrate, the substrate provided with a pad and a white oil layer covering wiring;
S20, providing a spraying device, where the spraying device includes a liquid circulation unit, a pressurization flow-control unit connected to the liquid circulation unit, and a nozzle connected to the pressurization flow-control unit;
S30, placing a steel mesh on the substrate, where the steel mesh is disposed corresponding to the pad;
S40, introducing a suspension containing solder paste into the liquid circulation unit, and mixing uniformly;
S50, using the pressurization flow-control unit to control an amount of spraying of the nozzle, and spraying the suspension on the pad, to form a solder paste film layer;
S60, placing an LED wafer on the solder paste film layer; and
S70, carrying out the substrate, on which the LED is placed, to a reflow process for the solder.

9. The die-bonding method for an LED as claimed in claim 8, wherein before the S60, the method further includes:
spraying, by the spraying device, soldering flux on the solder paste film layer to form a soldering-flux layer.

10. The die-bonding method for an LED as claimed in claim 9, wherein before the S60, the method further includes:
spraying, by the spraying device, an anti-oxidant on the soldering-flux layer to form an antioxidant layer.

11. The die-bonding method for an LED as claimed in claim 8, wherein the S40 includes:
S401, including, by the liquid circulation unit, a U-shaped tube, and introducing the suspension into the U-shaped tube; and
S402, introducing gas into both ends of the U-shaped tube to uniformly mix the suspension.

12. The die-bonding method for an LED as claimed in claim 11, wherein before the S401, the method further includes: mixing and stirring the solder paste with a low-boiling organic solvent to form the suspension.

13. The die-bonding method for an LED as claimed in claim 11, wherein in the S50, the nozzle sprays the suspension on the surface of the pad by row-by-row or column-by-column scanning.

14. The die-bonding method for an LED as claimed in claim 8, wherein an opening area of the nozzle is 0.5 to 0.8 times the area of the pad.

15. The die-bonding method for an LED as claimed in claim 8, wherein a vertical distance between the nozzle and the steel mesh is 1 to 5 mm.

16. The die-bonding method for an LED as claimed in claim 8, wherein after the S50, the steel mesh is detached from the substrate.

* * * * *